United States Patent [19]

Schneider-Gmelch et al.

[11] Patent Number: 4,587,184
[45] Date of Patent: May 6, 1986

[54] METHOD FOR MANUFACTURING ACCURATE STRUCTURES WITH A HIGH ASPECT RATIO AND PARTICULARLY FOR MANUFACTURING X-RAY ABSORBER MASKS

[75] Inventors: Brigitte Schneider-Gmelch; Joseph Mathuni, both of Munich, Fed. Rep. of Germany

[73] Assignee: Siemens Aktiengesellschaft, Berlin & Munich, Fed. Rep. of Germany

[21] Appl. No.: 618,416

[22] Filed: Jun. 7, 1984

[30] Foreign Application Priority Data

Jul. 27, 1983 [DE] Fed. Rep. of Germany ....... 3327088

[51] Int. Cl.⁴ ................................ G03F 9/00
[52] U.S. Cl. ........................ 430/5; 430/296; 430/323; 430/324; 430/967; 430/966; 378/34; 378/35; 156/655; 156/659.1
[58] Field of Search .............. 430/5, 296, 316, 323, 430/324, 967, 966; 156/654, 655, 659.1; 378/34, 35

[56] References Cited

U.S. PATENT DOCUMENTS

| 3,855,023 | 12/1974 | Spicer et al. | 156/11 |
| 4,152,601 | 5/1979 | Kadota et al. | 378/35 |
| 4,342,817 | 8/1982 | Bohlen et al. | 430/5 |
| 4,448,865 | 5/1984 | Bohlen et al. | 430/5 |

FOREIGN PATENT DOCUMENTS

| 27237 | 9/1979 | Japan | 430/967 |
| 56-22433 | 3/1981 | Japan | 378/35 |
| 58-114427 | 7/1983 | Japan | 430/5 |

OTHER PUBLICATIONS

Horz et al., "The Role of Surface Phenomena in the Interactions of Reactive Metals with Gases", *Vacuum*, vol. 33, No. 5, 1983, pp. 265-270.

Cantagrel, "Considerations on High Resolution Patterns Engraved by Ion Etching", *IEEE Transactions on Electronic Devices*, vol. ED-22, No. 7, July 1975, pp. 483-486.

*Primary Examiner*—John E. Kittle
*Assistant Examiner*—José G. Dees
*Attorney, Agent, or Firm*—Hill, Van Santen, Steadman & Simpson

[57] ABSTRACT

A method for manufacturing structures having dimensions in a range of 1 μm and below in a layer of material by applying an auxiliary layer consisting of metal or metal oxide on the layer to be structured and utilizing a lacquer mask to structure the auxiliary layer to form a mass therein for the etching of the layer to be structured, characterized by passivating the auxiliary layer by applying a protective layer to prevent oxidizing of the auxiliary layer until a desired time. The protective layer can be gold or platinum and the auxiliary layer can be selected from a group consisting of titanium, hafnium, zirconium, vanadium, chromium, manganese, aluminum, niobium and tantalum. The method is particularly useful to manufacuture absorber structures of X-ray masks that are used in microelectronics.

9 Claims, 5 Drawing Figures

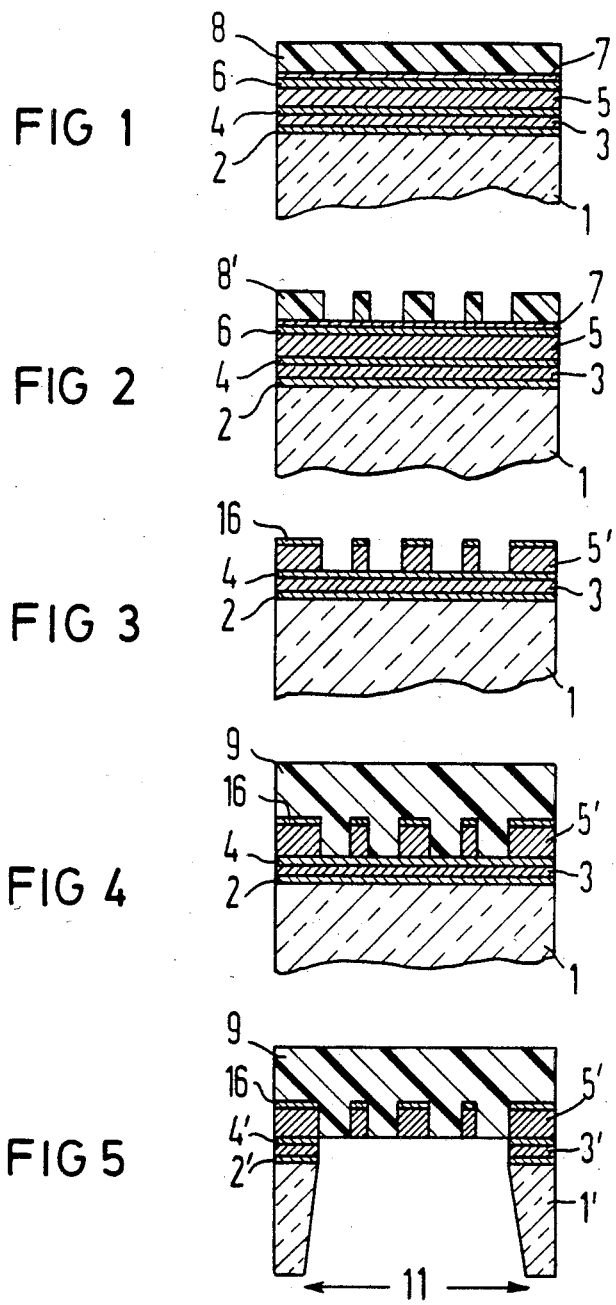

METHOD FOR MANUFACTURING ACCURATE STRUCTURES WITH A HIGH ASPECT RATIO AND PARTICULARLY FOR MANUFACTURING X-RAY ABSORBER MASKS

BACKGROUND OF THE INVENTION

The present invention is directed to a method for manufacturing dimensionally accurate structures in a layer with a high aspect ratio and with dimensions in a range of 1 μm and below. The method is particularly useful for the production of a mask for microelectronics. The method includes applying an auxiliary layer consisting of a metal or metal oxide on the layer to be structured and providing a lacquer layer on the auxiliary layer forming a mask in the lacquer layer, etching the auxiliary layer to form a mask in the auxiliary layer, and then subsequently etching the layer to be structured utilizing the mask formed in the auxiliary layer.

Ion beam etching processes are utilized in the manufacturing of dimensionally accurate sub-micron structures and structures having a high aspect ratio. A high aspect ratio is obtained when the height of the gap is substantially greater than the width of the gap. In these processes, the layer which is to be structured is either directly covered by a lacquer layer which is sensitive to radiation from a group consisting of photons, electrons, X-rays or ions or has an auxiliary layer interposed between the lacquer layer and this layer to be structured. The auxiliary layer is selected of a material consisting of metals, metal oxides and metal organic compounds.

The structurability of the auxiliary layer is very problematical because it is extremely dependent on the process sequence in the technology and is difficult to be reproduced. Boundary layers that have a very negative effect on the selectivity in the etching process are formed namely at exposed surfaces. Further details of the formation of boundary layers is discussed in an article by G. Hörz et al, "The Role of Surface Phenomena in the Interactions of Reactive Metals with Gases", *Vacuum*, Vol. 33, No. 5 (1983), pages 265–270.

It is known from an article by M. Cantagrel, "Considerations of High Resolution Patterns Engraved by Ion Etching", *IEEE Transactions on Electron Devices*, Vol. ED-22, No. 7, July 1975, pages 483–486 to apply a thin metal film consisting of, for example, titanium, vanadium, manganese or aluminum over the layer to be etched and to structure this metal film by utilizing a lacquer mask. This structured metal film itself then serves as a mask for the layer therebelow. The fact is thereby exploited that in the case of many metals, the etching rate of the oxide with argon ions is significantly lower than the etching rate with argon ions of the metal itself. In this manner, the corresponding metal can first be structured by means of, for example, ion beam etching with pure argon and then be further employed as a mask when the etching is continued with a mixture consisting of argon and oxygen. The metal oxide is then formed at the surface of the metal mask during the etching.

However, this method has the disadvantages that the metal layer intended for use as a mask often becomes coated with an oxide layer before the structuring, for example, during storage of the substrates as well as upon application and heating of the lacquer layer. This prior oxide coating complicates the etching process. The selectivity relative to the employed lacquer layer particularly when utilizing a PMMA (polymethylmethacrylate) is too low in order to avoid a lacquer shrink. This leads to the loss of dimension and, thus, to oblique and undefined edges in the auxiliary layer which in turn cannot be transferred to the structured layer with dimensional accuracy.

SUMMARY OF THE INVENTION

The object of the present invention is to provide a method for ion etching wherein the above mentioned disadvantages do not occur.

This object is accomplished by an improvement in the method of manufacturing dimensionally accurate structures in a range of 1 μm and below with a high aspect ratio, which method comprises applying an auxiliary layer selected of a group consisting of metal and metal oxides on a layer to be structured, covering the auxiliary layer with a lacquer layer of a material sensitive to radiation selected from a group consisting of photons, electrons, X-rays and ions forming a mask in the lacquer layer to exposed portions of the auxiliary layer, etching the exposed portions of the auxiliary layer to form a second mask therein and then etching the layer to be structured by utilizing the second mask. The improvement in the simplest form comprises passivating the auxiliary layer by applying a protective layer directly on the auxiliary layer before applying a lacquer layer. The protective layer or passivation layer has the function of protecting the exposed boundary surfaces of the material of the auxiliary layer against chemical reaction, for example, against oxidation in a case of metals. The protective layer also acts as a barrier layer or as an etching stop, Thus the storage of the substrate as well as a change of systems or processes is significantly facilitated.

The auxiliary layer can be a metal or metal combination and the protective layer is then preferably selected from a group consisting of gold, platinum, silver, palladium or copper. If the auxiliary layer is a metal oxide, then a carbon layer is preferably utilized as the protective or passivation layer. If the auxiliary layer is a metal or combination of metals, it is a material selected from a group consisting of titanium, hafnium, zirconium, vanadium, chromium, manganese, aluminum, niobium, tantalum and combinations thereof.

The method according to the teachings of the present invention will be described in greater detail and specifically with reference to a particularly favorable exemplary embodiment for manufacturing an X-ray absorbent mask which method utilizes a plurality of etching steps.

BRIEF DESCRIPTION OF THE DRAWINGS

FIG. 1 is a cross-sectional view of the substrate having a plurality of layers provided on one surface thereof;

FIG. 2 is a cross-sectional view of the substrate after forming a mask in the uppermost layer;

FIG. 3 is a cross-sectional view after a first etching step which removes the mask of FIG. 2 and structures portions of the layers;

FIG. 4 is a cross-sectional view after applying a protective plastic layer on the structured surface to fill the cavities formed therein; and FIG. 5 is a cross-sectional view after etching from the opposite side to remove portions of the underlying layer and the substrate to form the article.

DESCRIPTION OF THE PREFERRED EMBODIMENTS

The principles of the present invention are particularly useful in a method for forming an X-ray absorber mask such as illustrated by the cross-sectional view of FIG. 5. To obtain such a structure, the first step of the method comprises providing a plate or substrate 1 which consists of, for example, glass, with a sandwich structure which consists of all of the required adhesions, etching stop, absorber, auxiliary and passivation or protective layers that are needed during the structuring in an ion beam etching installation. These layers are preferably applied by a vapor-depositing method and consist of a first adhesion layer 2, which is preferably 20 nm thick and is a titanium layer. Next, the adhesion layer 2 is covered by an etched stopping layer 3, which preferably has a thickness of 400 nm and consists of gold. The etched stopping layer 3 is utilized during the etching of the back of the glass carrier 1 in the transmission range or zone 11 illustrated in FIG. 5.

After applying the etched stopping layer 3, a layer sequence for the absorber structure comprises the layers 4, 5, 6 and 7 as applied. This structure includes a layer 4, which is either a second adhesion or an etching stop layer which is preferably a titanium layer and thus the second titanium layer and has a thickness of approximately 20 nm. On the second adhesion layer 4, an absorber layer 5 which is preferably a thick gold layer of a thickness of 800 nm is applied and thus forms a second gold layer. On the second gold or absorber layer 5, an auxiliary layer 6 of a thickness of 70 nm is applied. This auxiliary layer 6 preferably is a titanium layer and thus forms the third titanium layer on the substrate 1. On this auxiliary layer 6, a protective or passivating layer 7 of a thickness of 30 nm is applied. Preferably, this is a gold layer and thus forms the third gold layer on the substrate 1. The gold passivation layer 7 will prevent the entire or partial conversion of the third titanium layer 6 into titanium oxide before the structuring. On top of the passivation or protective layer 7, a lacquer layer 8 of PMMA, which is sensitive to electron beams, is applied in a layer thickness of 1000 nm. With the application of a lacquer layer, the cross-section illustrated in FIG. 1 is obtained.

In the next step, a lacquer or first mask 8' (FIG. 2) is formed in the lacquer layer 8 by means of electron beam writing to expose portions of the layer disposed immediately therebeneath. After forming the mask 8', the remaining structure is subsequently etched in a four-stage etching process in an ion beam etching installation. The gold passivating layer 7 and the titanium auxiliary layer 6 are physically structured by means of an argon ion bombardment. Then the remaining portions of the titanium layer 6 are converted into a titanium oxide layer 16 (FIG. 3) by means of adding oxygen during the next etching step in order to achieve a higher selective etching rate of the absorber layer 5 lying therebelow so as to be able to structure this with the desired dimensional accuracy. The addition of oxygen leads to a reactive etching process. The etching rate of gold is reduced by 15% and that of the titanium is reduced by 95% due to the additional oxygen when the remaining system parameters remain constant.

The arrangement illustrated in FIG. 3 is after the removal of the lacquer mask 8 and the remaining structure of the gold layer 7 and the subsequent oxidation of the titanium auxiliary mask 6 into a titanium oxide mask 16. The arrangement also shows the structuring of the gold absorber layer 5 into the absorber mask 5'. The parameters during etching may be derived from the following table:

| Etching Step | Etching Angle | Etching Time | Etching Gas |
| --- | --- | --- | --- |
| I | 0° | 5 min. | 3 sccm argon |
| II | 30° | 15 min. | 3 sccm argon |
| III | 30° | 15 min. | 3 sccm argon + |
| IV | 0° | 10 min. | 5 sccm O$_2$ |

In the first etching step (I), the passivating or protective layer 7 is removed and the titanium auxiliary layer 6 is structured during the second etching step (II). Etching into the gold layer 5 will already be commenced during the second etching step in order to have a shadow effect in the gold and not in the titanium layer 6. The perpendicular edges of the titanium layer 6 are thus obtained. In the third etching step (III), oxygen is added and the titanium layer 6 is converted into a titanium oxide layer 16. The remaining lacquer layer 8 disappears very quickly so that a thin titanium oxide layer 16 serves as the sole etching mask. The etching occurs at an etching beam angle of 30°. The shadowing effect is reduced by means of a low mask height. The fourth etching step (IV) occurs at a beam angle of 0° in order to also be able to etch a narrow trough and to be able to eliminate the foot of the gold layer 5.

Fluctuations in the reproducibility of the etching lie below 10% when working with structure of 0.5 $\mu$m. This is assuming that the absorber layer has a thickness of 800 nm.

As may be seen in FIG. 4, after forming the structure in the layer 5, a polyimide layer 9 having a thickness of 2000 to 5000 nm is applied to the etched structure. As illustrated, this layer 9 fills all of the cavities etched in the layers 5' and engages the exposed portions of the surface 4.

After applying the polyimide layer 9 which penetrates the portions removed from the etched absorber layer or structure 5', a back-etching from the other surface of the substrate 1 as well as the titanium layers 2, the gold layer 3 and the titanium layer 4, is carried out in a transmission region 11 (FIG. 5). This back-etching includes providing a mask on the carrier 1 which mask exposes the region 11 and etching with argon as an etching gas in an ion beam etching system utilizing an ion current density of 0.2 mA/cm$^2$ and an acceleration voltage of 500 eV. The 400 nm thick gold layer 3 forms a good etching stop during the etching of the glass substrate. After the etching, the substrate will have the configuration illustrated in FIG. 5 by the etched substrate 1' and the layers 2, 3 and 4 will also have the configuration illustrated by the etched layers 2', 3' and 4'.

In addition to titanium, the method of the invention can also be utilized for other metallic auxiliary masks, for example, hafnium, zirconium, vanadium, chromium, manganese, aluminum, niobium and tantalum. Gold, platinum or carbon can be utilized as the etching stop layer specifically given a dry etching of metal oxide such as, for example, aluminum oxide, silicon oxide, titanium oxide and tungsten oxide.

A further application area of the passivation layer is in the function as a barrier layer preventing the penetration of the developer solutions to metallo-organic or organic substrates, for example, given employment in multiple layer systems. For example, the passivation layer can be used on inorganic intermediate layers between two photoresists or between upper photoresists and an organic layer therebelow which consists, for example, of a polyimide.

As mentioned hereinabove, the passivation layer 7 can be selected from a group consisting of gold or platinum when the auxiliary layer 6 consists of metal or metal combinations. If the auxiliary layer 6 is a metal oxide, then the passivation layer can be a carbon layer. The substrate 1 can consist of a material selected from a group consisting of glass, quartz and silicon.

Although various minor modifications may be suggested by those versed in the art, it should be understood that we wish to embody within the scope of the patent granted hereon, all such modifications as reasonably and properly come within the scope of our contribution to the art.

We claim:

1. A method of manufacturing an X-ray absorber mask comprising the steps of providing a substrate of a material selected from a group consisting of glass, quartz and silicon; applying a first adhesion layer on the substrate; applying a first back-etching layer on the first adhesion layer; applying a second adhesion layer on the back-etching layer; applying an absorption layer on the second adhesion layer; applying an auxiliary layer on the absorber layer; applying a passivation layer on the auxiliary layer; applying a lacquer layer on the passivation layer, said lacquer layer being a material sensitive to radiation selected from a group consisting of X-rays, photons, ions and electrons; forming a mask in the lacquer layer to expose portions of the passivation layer, said step of forming a mask including exposing the lacquer layer to radiation of said group; etching exposed portions of the passivation layer and the underlying portions of the auxiliary layer and absorber layer with an ion beam etching with argon as an etching gas for a given duration of time, said duration of time being broken up in different segments and said etching step including changing the etching angle of the beam at the beginning of each segment; then removing the lacquer mask and the passivation layer; oxidizing the auxiliary layer to form an oxide mask; subsequently etching the absorber layer utilizing the oxide mask to produce the absorber mask with the desired structure, said etching being a reaction ion beam etching for a given duration of time with oxygen and argon being the etching gases, said duration of time being broken into segments with the direction of the etching beam being changed at the beginning of each segment; applying a polyimide layer on the etched surface to fill all of the cavities formed in the absorber mask, then etching the opposite side of the substrate to remove selected portions of the substrate, the first and second adhesion layers and the first back-etching layer to expose the desired structure in the absorber mask, said etching being an ion beam etching with argon as the etching gas.

2. A method according to claim 1, wherein the passivation layer is of a material selected from a group consisting of gold, platinum, silver, palladium and copper.

3. A method according to claim 2, wherein the passivation layer has a thickness in the range of 20 to 50 nm and the thickness of the auxiliary layer is in the range of 50 to 100 nm.

4. A method according to claim 1, wherein the auxiliary layer is of a material selected from a group consisting of titanium, hafnium, zirconium, vanadium, chromium, manganese, aluminum, niobium and tantalum.

5. A method according to claim 4, wherein the passivation layer is of a material selected from a group consisting of platinum, gold, silver, palladium and copper.

6. A method according to claim 5, wherein the passivation layer has a thickness in the range of 20 to 50 nm and the auxiliary layer has a thickness in the range of 50 to 100 nm.

7. A method according to claim 1, wherein each of the first and second adhesion layers and the auxiliary layer are titanium layers, wherein the first back-etching layer, the absorber layer and the passivation layer are gold layers.

8. A method according to claim 1, wherein the auxiliary layer consists of a material selected from a metal or metal combinations and the passivation layer is selected from a group consisting of gold, platinum, silver, palladium and copper.

9. A method according to claim 1, wherein the auxiliary layer consists of a metal oxide and the passivation layer comprises a carbon layer.

* * * * *